US012451350B1

(12) United States Patent
Shiri et al.

(10) Patent No.: US 12,451,350 B1
(45) Date of Patent: Oct. 21, 2025

(54) PRECISION FABRICATION OF PATTERNED SHAPES ON SILICON WAFERS WITH ULTRA-ABSORBENT BLACK SILICON

(71) Applicant: United States of America as represented by the Administrator of NASA, Washington, DC (US)

(72) Inventors: Ron Shiri, Glyndon, MD (US); Christine Jhabvala, Greenbelt, MD (US); William Zhang, Ellicott City, MD (US); Timo Saha, Harwood, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 418 days.

(21) Appl. No.: 17/977,089

(22) Filed: Oct. 31, 2022

Related U.S. Application Data

(60) Provisional application No. 63/274,283, filed on Nov. 1, 2021.

(51) Int. Cl.
| | | |
|---|---|---|
| *H01L 21/02* | (2006.01) | |
| *H01L 21/304* | (2006.01) | |
| *H01L 21/3065* | (2006.01) | |
| *H01L 21/324* | (2006.01) | |

(52) U.S. Cl.
CPC .. *H01L 21/02639* (2013.01); *H01L 21/02381* (2013.01); *H01L 21/02532* (2013.01); *H01L 21/304* (2013.01); *H01L 21/3065* (2013.01); *H01L 21/324* (2013.01)

(58) Field of Classification Search
CPC .............. H01L 21/304; H01L 21/3065; H01L 21/0274; H01L 21/027; H10K 71/233; G02B 23/02; G02B 23/00; G02B 23/12
See application file for complete search history.

(56) References Cited

U.S. PATENT DOCUMENTS

| | | | |
|---|---|---|---|
| 10,534,165 B1 * | 1/2020 | Carlson ................... | G02B 23/00 |
| 2005/0163184 A1 * | 7/2005 | Hilliard ............... | H01S 3/08004 |
| | | | 372/66 |
| 2015/0228298 A1 * | 8/2015 | Han ...................... | G03F 7/0002 |
| | | | 216/22 |

OTHER PUBLICATIONS

Balasubramanian et al. (WFIRST-AFTA coronagraph shaped pupil masks: design, fabrication, and characterization, 2016, Journal of Astronomical Telescopes, Instruments, and Systems 2(1), 011005 (Year: 2016).*

(Continued)

*Primary Examiner* — Ajay Ojha
*Assistant Examiner* — Sandra Milena Rodriguez Villanu
(74) *Attorney, Agent, or Firm* — Derek J. Langdon; Matthew F. Johnston; Trenton J. Roche

(57) ABSTRACT

A method of fabricating a patterned mask on a silicon wafer includes grind-polishing a pre-cut silicon wafer; ion beam figuring the grind-polished silicon wafer, transferring a coronagraphic pattern to a surface of the ion beam figured silicon wafer; and in a cryogenic deep reactive ion etching process, applying black silicon to exposed silicon regions of the ion beam figured silicon wafer. The cryogenic etching process is used to fabricate black silicon to achieve a high aspect ratio structure with higher etch rate than conventional reactive ion etching.

5 Claims, 6 Drawing Sheets

(56) References Cited

OTHER PUBLICATIONS

Shiri et al. (Highly absorptive pupil mask fabricated with black-silicon, 2019, Proc. SPIE 11116, Astronomical Optics: Design, Manufacture, and Test of Space and Ground Systems II, 111161H (Year: 2019).*

* cited by examiner

PRECISION FABRICATION OF PATTERNED SHAPES ON SILICON WAFERS WITH ULTRA-ABSORBENT BLACK SILICON

INVENTION BY GOVERNMENT EMPLOYEE(S) ONLY

The invention described herein was made by one or more employees of the United States Government, and may be manufactured and used by or for the Government for governmental purposes without the payment of any royalties thereon or therefore.

ORIGIN OF THE INVENTION

Field

The aspects of the disclosed embodiments relate generally to the fabrication of patterned shapes on silicon wafers for spaced-based applications, and more particularly to fabricating patterned masks on silicon wafers with ultra-absorbent black silicon etching.

BACKGROUND

Precision optical testbeds, space-based telescopes with coronagraphs, and flight missions in need of obstructing incoming light use masks on the precision flat surfaces that are highly diffraction-limited. These patterned masks employ ultra-absorptive regions as much as several orders of magnitude of specular reflectance within the wavelength of the incident beam.

Efforts to create a very absorbent layer that reduces and/or mitigates stray light has included paint Z306/307 and carbon nanotube coating. However, these coating techniques are only suitable within the visible range and the applied surface can easily be contaminated.

Accordingly, it would be desirable to provide a fabrication process and a patterned mask that addresses at least some of the problems described above.

SUMMARY

The aspects of the disclosed embodiments are directed to fabricating patterned masks on silicon wafers. The ion beam figuring (IBF)-polished silicon wafers are fabricated with patterned shapes lithographically, and black-silicon is etched on the non-reflective regions using a cryogenically etching process. The fabricated mask on the wafer could be used as a coronagraph in an optical testbed, space-based telescopes, and flight missions. This and other advantages of the disclosed embodiments are provided substantially as shown in, and/or described in connection with, at least one of the figures, as set forth in the independent claims. Further advantageous modifications can be found in the dependent claims.

According to a first aspect the disclosed embodiments are directed to a method of fabricating a patterned mask on a silicon wafer. In one embodiment, the method includes grind-polishing a pre-cut silicon wafer; ion beam figuring the grind-polished silicon wafer; transferring a coronagraphic pattern to a surface of the ion beam figured silicon wafer; and in a cryogenic deep reactive ion etching process, apply black-silicon to exposed silicon regions of the ion beam figured silicon wafer The fabrication process of the disclosed embodiments addresses the diffraction-limited flatness of the reflective surface and the ultra-absorptive material to reduce the specular reflectance of the absorbing region.

In a possible implementation form, the method further includes grind-polishing the pre-cut silicon wafer to a diffraction-limit of lambda/4.

In a possible implementation form, the method further includes using the IBF process to improve the diffraction limit to lambda/20.

In a possible implementation form, the method further includes measuring a wavefront error of the silicon wafer before and after the grind-polishing and before and after the IBF to ensure a flatness of a surface of the silicon wafer.

In a possible implementation form, after the ion beam figuring, the method further includes depositing a highly reflective metal on a surface of the silicon wafer using vacuum deposition; photolithographically transferring the coronagraphic pattern to the surface of the silicon wafer; etching the coronagraphic pattern into the highly reflective metal, wherein regions of bare silicon are left exposed to form a patterned wafer; and subjecting the patterned wafer to the cryogenic deep reactive ion etching to form absorbing black-silicon in the exposed silicon regions.

These and other aspects, implementation forms, and advantages of the exemplary embodiments will become apparent from the embodiments described herein considered in conjunction with the accompanying drawings. It is to be understood, however, that the description and drawings are designed solely for purposes of illustration and not as a definition of the limits of the disclosed invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

In the following detailed portion of the present disclosure, the aspects of the disclosed embodiments will be described in more detail with reference to the example embodiments shown in the drawings, in which.

DETAILED DESCRIPTION OF THE DISCLOSED EMBODIMENTS

The following detailed description illustrates exemplary aspects of the disclosed embodiments and ways in which they can be implemented. Although some modes of carrying out the aspects of the disclosed embodiments have been disclosed, those skilled in the art would recognize that other embodiments for carrying out or practicing the aspects of the disclosed embodiments are also possible.

Figure 1:
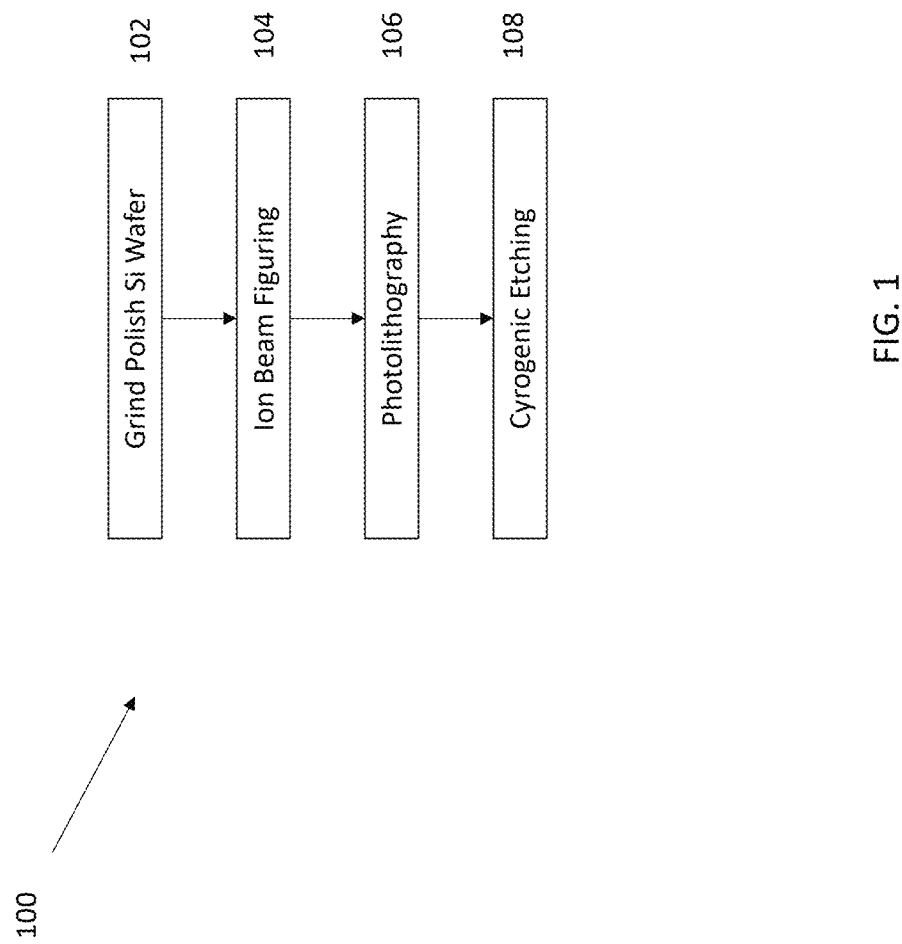
FIG. 1 is flow diagram of an exemplary process incorporating aspects of the disclosed embodiments.

FIG. 1 is a flowchart of an exemplary process 100 incorporating aspects of the disclosed embodiments. The disclosed embodiments are generally directed fabricating patterned masks on silicon wafers. In one embodiment, ion beam figuring (IBF)-polished silicon wafers are fabricated with patterned shapes lithographically, and black-silicon is etched on the non-reflective regions using a cryogenically etching process. The fabrication process of the disclosed embodiments addresses the diffraction-limited flatness of the reflective surface and the ultra-absorptive material to reduce the specular reflectance of the absorbing region. The fabricated mask on the wafer could be used as a coronagraph in an optical testbed, space-based telescopes, and flight missions.

In one embodiment, the method 100 includes a two-step process of grind-polishing step 102 to remove wavefront aberrations followed by ion-beam figuring polishing step 104 to obtain highly flat surface. The photolithography 106 of the patterned mask is followed by cryogenic etching 108 of black-silicon.

The first step of the disclosed process is the grind-polishing 102 of a bulk or pre-cut silicon wafer. The wafer is polished to obtain a generally flat surface. For example, the bulk or pre-cut silicon wafer can be grind-polished to a diffraction-limit of lambda/4, where lambda is the incident beam's wavelength. The result is a diffraction-limited wafer.

In a follow-up process, the diffraction-limited wafer will go through precision polishing using an ion beam figuring (IBF) technique. In one embodiment, the IBF process is configured to improve the surface figure on the wafer from lambda/4 to lambda/20. The wavefront error of the wafer before and after each polishing technique is measured to ensure the flatness of the surface and adherence of root mean square error to the desired target.

In one embodiment, a highly reflective metal is first deposited on the wafer by means of vacuum deposition. A coronagraphic pattern is then photolithographically transferred to the surface of the wafer, and the pattern is etched into the reflective metal, leaving regions of bare silicon exposed. The patterned wafer is then subjected to cryogenic deep reactive ion etching, to form absorbing black-silicon in the exposed silicon regions. The process is then complete.

Figure 2:
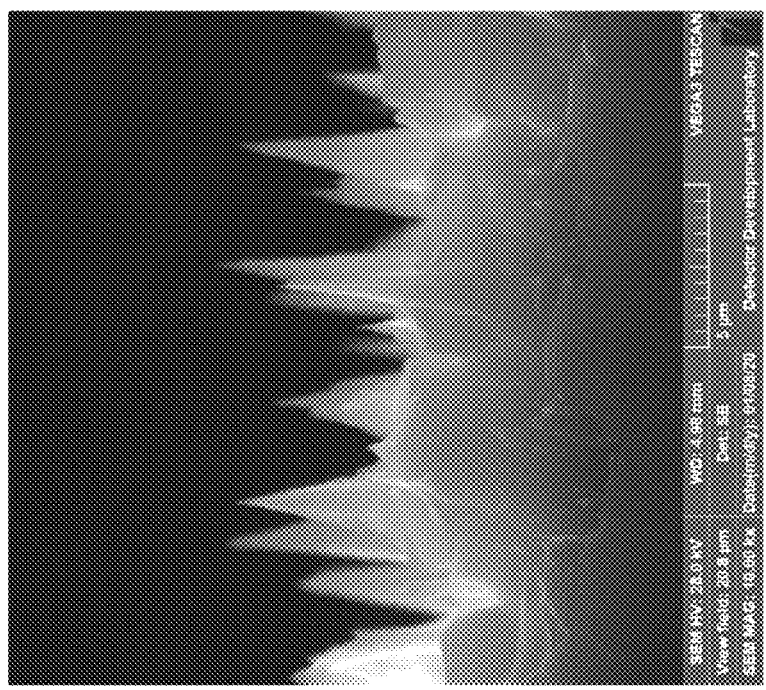
FIG. 2 illustrates a Scanning Electron Microscope (SEM) image of a uniformly cryogenically etched black-silicon wafer formed in accordance with the aspects of the disclosed embodiments.

The uniform black silicon (BSi) cryogenically etched has been demonstrated as a superior absorber in par with other ultra-absorbers such as carbon nanotubes in the visible and near-infrared spectrum. In the fabrication of a series of uniformly etched wafers at the 2.5-5 microns range, fabrication results show silicon needles of 8 micron height that have five orders of magnitude specular reflectance in the infrared region. FIG. 2 is an optical characterization showing that the wafer with pillars of approximately 8 micron height have the highest absorption within the 2-5 micron range. The 3D modeling of the BSi shows that longer pillar heights could be better absorbers in the same range, or as the wavelength increases.

In a highly absorbent process according to the aspects of the disclosed embodiments, a series of uniform black-silicon wafers are cryogenically etched by varying a number of parameters. In the cryogenic etching processing of BSi, seven parameters are used to determine the etch characteristic: 1) The Sulfur hexafluoride (SF6) flow rate that primarily affects ion Fluoride density, 2) O2 flow rate that to increase passivation that leads to micro-masking and enabling black silicon formation, 3) Inductively Coupled Plasma (ICP) power to increase ion density, 4) Forward power that affects etch depth and remove the passivation layer, 5) Chamber pressure to increase ion density, 6) Chamber temperature to enable the formation of the passivation layer, and 7) Etch duration that affects etch depth. Out of these, two parameters contribute to the creation of BSi. Mainly, the oxygen flow rate and chamber temperature in the form of micro-masking and passivation. All of these parameters add to the blackness of the substrate, and the parameters can be optimized to obtain various levels of blackness (grayscale).

For instance, the etch duration of 10 minutes produces sub-optimal results. Increasing the etch duration to 20 or 30 minutes exhibits a monotonic relation between the reflectivity and etch time. However, as the time increases, the reflectivity decreases. On the variation of ICP power (ion density), the lowest ICP power exhibits lower reflectivity up to a point.

Figure 3:
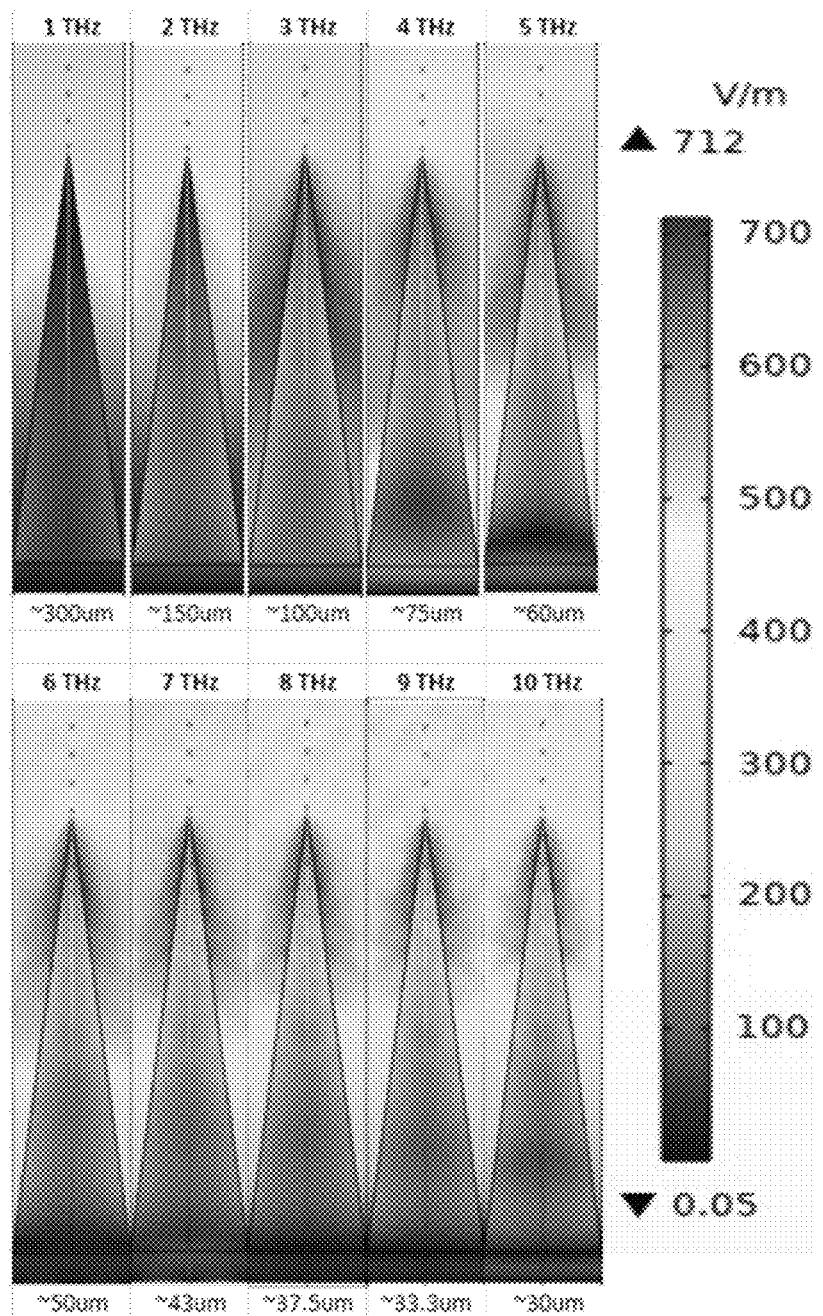
FIG. 3 illustrates the electric field distribution in a unit cell formed in accordance with the aspects of the disclosed embodiments.

A mathematical model of a 3D BSi unit cell was developed in COMSOL and optimized to the geometrical shape relative to the wavelength of the incident beam. FIG. 3 illustrates the electric field distribution in a unit cell of pyramidal geometry. As the height of pyramid increases relative to the wavelength, the absorption at the tips increases to maximum and stays at max as wavelength decreases.

An infinite 2D array of the (cones or pyramidal) structures is modeled using a one-unit cell with Floquet periodic boundary conditions on four sides. The one-unit cell's geometry consists of one pyramid or cone confined to a block made of the same material. There are perfectly matched layers (PML) above the structure, and the remaining space between the structure and the PMLs is filled with air. The pyramid or cone absorber is made of conductive material. At the interface of the conductive material and air, the incident field is partially reflected and partially transmitted into the pyramid or cone. The transmitted field is attenuated inside of the lossy material.

For angles within a particular range of normal incidence, the propagation direction of the reflected field is not back toward the source, but instead toward another surface of the conductive material. The process of partial reflection and partial transmission with subsequent attenuation is repeated until the field reaches the base of the structure.

The amplitude of the field at the bottom of the structure is drastically reduced. Then the reflection from the absorber at this point is marginal. The intensity of the incident wave is strong near the tip of the absorber. As illustrated in FIG. 3, the intensity of the incident wave decreases toward the base of the pyramid or cone, where it is ultimately very weak.

Figure 4:
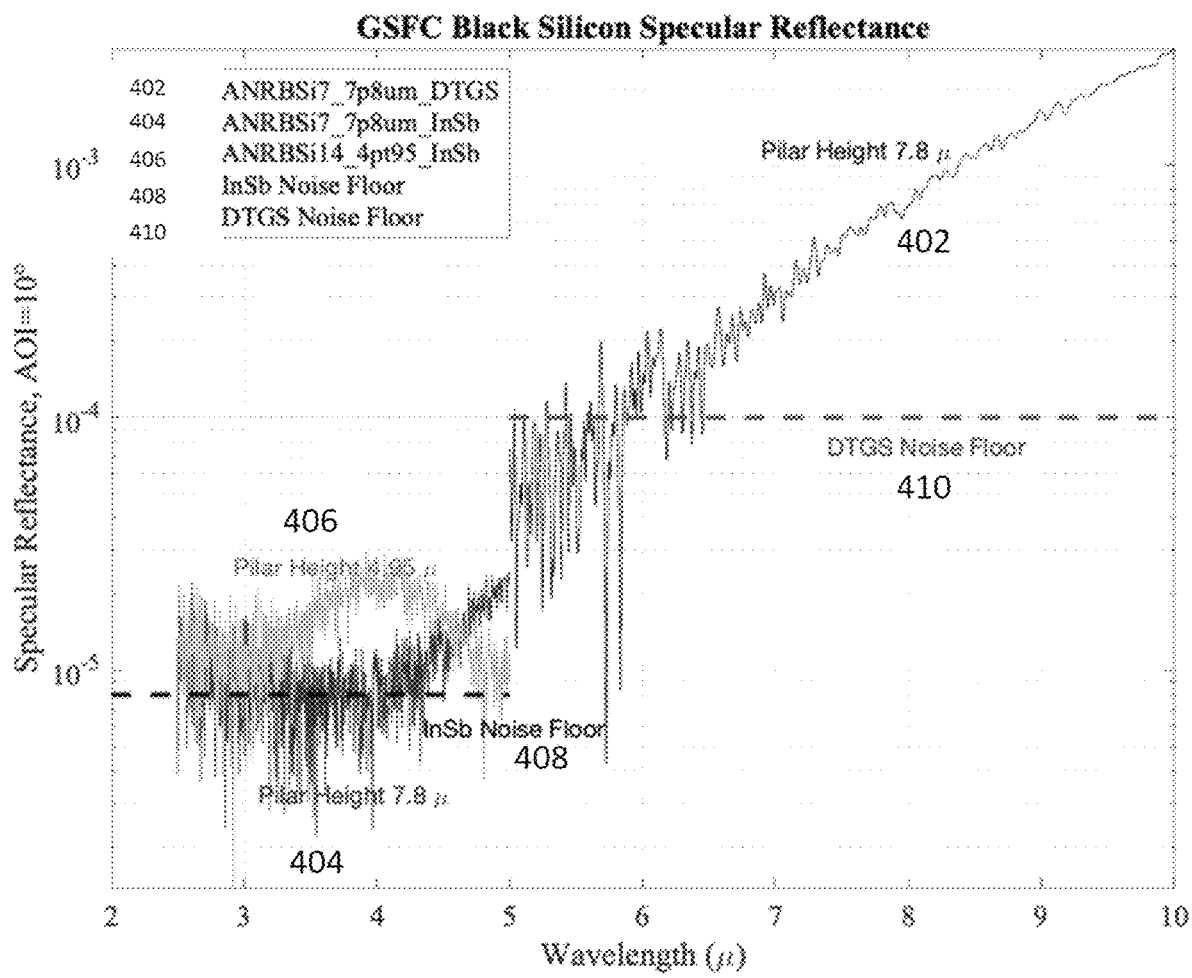
FIG. 4 is a graph illustrating the specular reflectance of BSI etched wafers formed in accordance with the aspects of the disclosed embodiments.

Referring to FIG. 4, the optical characterization of the BSi-etched wafers was conducted using Bruker IFS 125 HR Fourier Transform Spectrometer (FTS) in conjunction with a liquid helium cooled bolometric detector over the spectral range of 2-10 microns. For the 2-5 μm, an indium antimonide (InSb) detector was employed and for the longer wavelengths 5-10 μm, a deuterated lanthanum alpha alanine doped triglycine sulfate (DLaTGS) detector was used. The bean angle of incident was set to 10 degrees.

The specular reflectance of BSi-etched wafers is shown in FIG. 4. The ANRBSi7_7p8 um wafer with 8-micron height pillars, illustrated by line 402, shows the lowest reflectivity in the 2-10 micron range. Line 404 represents the ANRBSi7_7p8 um_InSb wafer, line 406 the ANRBSi14_4pt95_InSb, line 408 the InSb Noise Floor and line 410 the DTGS Noise Floor.

Figure 5:
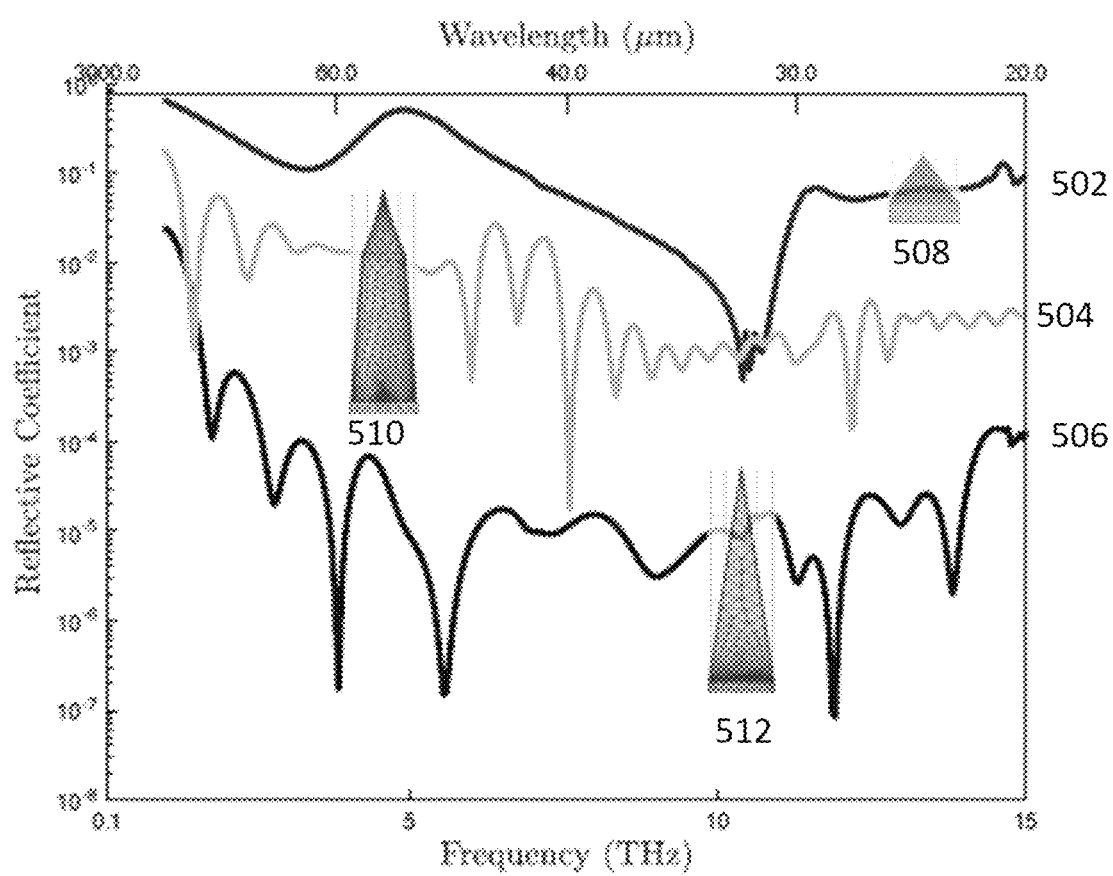
FIG. 5 is a graph comparing reflectance coefficient of BSI unit cell geometries formed in accordance with the aspects of the disclosed embodiments.

A comparison of the reflectance coefficient of BSi unit cell geometries is illustrated in FIG. 5. As illustrated in FIG. 5, a pyramid geometry with a height of approximately 12 microns shows the lowest reflectance in broadband frequencies. Line 502 represents the reflectance of the pyramid 508 with a height of 15 µm. Line 504 represents the cone-c geometry 510 with height of 100 µm. Line 506 represents the pyramid geometry 512 with a height of 120 µm. The height was selected to be twice the wavelength at 60 µm~ 5 THz frequency. The unit cell base dimension in all models was set to 20×20 µm$^2$.

As an example, many of NASA's direct imaging of exoplanet missions and projects require fabricated coronagraph masks to control scattering and diffraction of light. The designed, patterned mask intended for the coronagraphic testbeds are highly absorptive in the visible range on non-metallic regions. The cryogenic etching process to fabricate black silicon as described herein achieves high aspect ratio (HAR) structures with higher etch rate than conventional reactive ion etching (REI).

Figure 6:
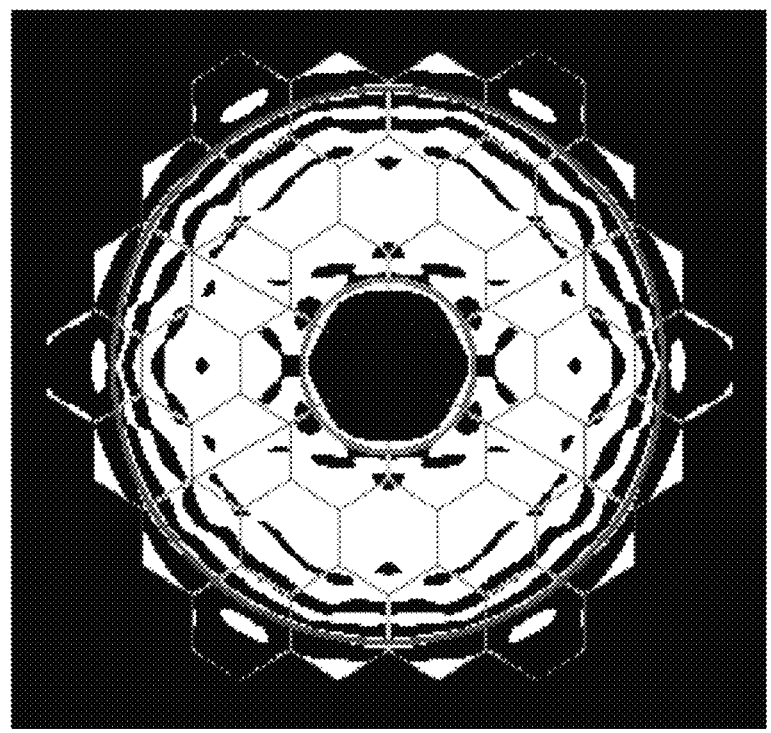
FIG. 6 illustrates a typical binary pupil mask for the HiCAT test bed formed in accordance with the aspects of the disclosed embodiments.

The telescope aperture of the High-contrast Imager for Complex Aperture Telescopes (HiCAT) testbed consists of a 20-mm entrance pupil mask with central obstructions, spiders, and 37 hexagonal segments Iris AO deformable mirror used in a conjugated plane to provide segmented pupil. FIG. 6 illustrates a typical binary pupil mask 600 for the HiCAT test bed. The diameter of the mask is about 25.4 mm with smallest features of a few microns.

A master lithographic of the typical mask is fabricated on a silicon wafer using E-beam writing with 1-micron minimum feature size. In these masks, the white regions are reflective, and the dark areas are absorptive. The absorption of the dark areas is enhanced by employing the cryogenic etching of the black silicon.

The polishing of a silicon mirror starts with single-crystal silicon, a hard-brittle non-metallic element used in the manufacturing of computer chips. The block of silicon is heated to eliminate any stress that may have arisen from its handling. A band saw is used to approximate the shape and use of other machining tools and chemicals to grind and refine the block's surface. The silicon wafer preparation for HiCAT involves the substrate slicing, dicing, and forming into a flat.

To achieve the ultra-precision polishing the mirror flat is subjected to ion beam figuring (IBF). This method is an alternative to mechanical polishing that is increasingly used for precise figuring and finishing optical elements such as spheres, aspheres, and free forms on lenses and mirrors. The structure and chemical characteristics of solid materials can be specifically modified through the bombardment of high energy ions.

In principle, the IBF process is based on the collision of particles on a microscopic scale where optimized process flow creates collision cascades directed back to the surface substrate enabling the atoms to overcome surface binding energy and remove a layer of the substrate. Additionally, the process is deterministic and non-contact, well suited for surfaces such as silicon to correct the residual error. Further, the process is immune from all the problematics derived by the interaction of figuring equipment and the handling and supporting systems.

The IBF employs a beam of an inert gas such as Argon ions to remove material from an optical surface using kinetic impact. The beam footprint performs a computer controlled path over the optical surface. A series of raster or spiral paths are commonly used on the targeted surface geometry with variable motion speed according to the dwell time map is applied to remove the exact amount of material locally. In practice, the material removal rate function exhibits a near-Gaussian shape with maximum removal rates of the order of 1-10 nm/s depending on the treated material and ion beam parameters. The tool function width (full width at half maximum-FWHM) is adjusted according to the targeted spatial surface error feature to make the machining process efficient.

Following the IBF polishing, the wafers are processed lithographically with the patterned mask generated numerically. In the subsequent cryogenic etching processing of BSi, the optimal setting was achieved when the height of the etching was around 5 microns with a substrate temperature of −100 C. An ultralow reflective black silicon on the surface of the wafer is obtained.

The aspects of the disclosed embodiments are directed to a chip fabrication process that addresses the diffraction-limited flatness of the reflective surface and the ultra-absorptive material to reduce the absorbing regions' specular reflectance. Employing a cryogenic etching process to fabricate black silicon results in a high aspect ratio structure with higher etch rate than conventional reactive ion etching. The patterned mask is imprinted on a diffraction-limited silicon wafer with silver/aluminum metal applied to the reflective area. Then a cryogenic etching process is used to fabricate BSi on the non-reflective region. Subsequent optical measurements based on the Bidirectional Reflectance Distribution Function (BRDF) of uniformly coated BSi on silicon wafer show highly diffusive BSi with a specular reflective component on the order of seven magnitudes lower than the total hemispherical reflectance when a polarized or non-polarized incident beam is used.

The patterned masks of the disclosed embodiments employ ultra-absorptive regions as much as several orders of magnitude of specular reflectance within the wavelength of the incident beam. The aspects of the disclosed embodiments find particular application with respect to precision optical testbeds, space-based telescopes with coronagraphs, and flight missions in need of obstructing incoming light use masks on the precision flat surfaces that are highly diffraction-limited, with root mean square (RMS) of a few nanometers-equivalent to lambda over 20.

Thus, while there have been shown, described and pointed out, fundamental novel features of the invention as applied to the exemplary embodiments thereof, it will be understood that various omissions, substitutions and changes in the form and details of devices and methods illustrated, and in their operation, may be made by those skilled in the art without departing from the spirit and scope of the presently disclosed invention. Further, it is expressly intended that all combinations of those elements, which perform substantially the same function in substantially the same way to achieve the same results, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method of fabricating a patterned mask on a silicon wafer, comprising:
   grind-polishing a pre-cut silicon wafer;

ion beam configuring the grind-polished silicon wafer using an infinite 2D array selected from of cones and pyramid structures with a one-unit cell with Floquet periodic boundary conditions on four sides whereby the one-unit cell's geometry consists of one of a selected pyramid and cone structure with matched layers (PML) above the structure, with remaining space between the structure and the PMLs filled with air configured as an absorber made of conductive material whereby at an interface of the conductive material and air, with the incident field partially reflected and partially transmitted into the structure;

transferring a coronagraphic pattern to a surface of the ion beam figured silicon wafer by photolithography; and in a cryogenic deep reactive ion etching process, applying black silicon to exposed silicon regions of the ion beam figured silicon wafer.

2. The method of claim 1, further comprising grind-polishing the pre-cut silicon wafer to a diffraction-limit of lambda/4.

3. The method of claim 1, further comprising using the IBF process to improve the diffraction limit to lambda/20.

4. The method of claim 1, further comprising measuring a wavefront error of the silicon wafer after the grind-polishing and before and after the IBF to ensure a flatness of a surface of the silicon wafer.

5. The method according to claim 1, wherein after the ion beam figuring, the method further comprises:

depositing a highly reflective metal on a surface of the silicon wafer using vacuum deposition;

photolithographically transferring the coronagraphic pattern to the surface of the silicon wafer;

etching the coronagraphic pattern into the highly reflective metal, wherein regions of bare silicon are left exposed to form a patterned wafer; and subjecting the patterned wafer to the cryogenic deep reactive ion etching to form absorbing black silicon in the exposed silicon regions.

\* \* \* \* \*